United States Patent
Chung et al.

[11] Patent Number: 6,150,207
[45] Date of Patent: Nov. 21, 2000

[54] METHOD FOR FABRICATING A CROWN CAPACITOR WITH ROUGH SURFACE

[75] Inventors: Shang Shu Chung; Yi-Nan Chen, both of Taipei, Taiwan

[73] Assignee: Nanya Technology Corporation, Taoyuan, Taiwan

[21] Appl. No.: 09/491,770

[22] Filed: Jan. 26, 2000

[30] Foreign Application Priority Data

Mar. 10, 1999 [TW] Taiwan ................................ 88103698

[51] Int. Cl.$^7$ ........................................... H01L 21/8242
[52] U.S. Cl. ..................... 438/239; 438/240; 438/244; 438/256; 438/396
[58] Field of Search .................................. 438/245, 253, 438/256, 396, 397, 240, 244, 239

[56] References Cited

U.S. PATENT DOCUMENTS

| | | | |
|---|---|---|---|
| 5,597,756 | 1/1997 | Fazan et al. | 437/52 |
| 5,597,760 | 1/1997 | Hirota | 437/60 |
| 5,877,052 | 3/1999 | Lin et al. | 438/238 |
| 5,897,352 | 4/1999 | Lin et al. | 438/255 |
| 5,962,886 | 10/1999 | Mori et al. | 257/309 |
| 5,994,181 | 11/1999 | Hsieh et al. | 438/239 |
| 5,994,197 | 11/1999 | Liao | 438/396 |
| 5,998,824 | 12/1999 | Lee | 257/309 |
| 6,048,763 | 4/2000 | Doan et al. | 438/239 |

*Primary Examiner*—Matthew Smith
*Assistant Examiner*—Renzo N. Rocchegiani
*Attorney, Agent, or Firm*—Darby & Darby

[57] ABSTRACT

This invention is related to a method for fabricating a crown capacitor with a rough surface, which comprises the steps of: forming a conducting layer which contacts the semiconductor source diffusion region on the substrate; forming an insulating layer on the conducting layer to form a stacked layer comprising the insulating layer and the conducting layer; defining the stacked layer to form a residue portion of the stacked layer adjacent to the semiconductor diffusion region; forming a plurality of first conducting spacers adjacent to side-walls of the stacked layer; forming a plurality of second conducting spacers having a rough surface adjacent to the first conducting spacers; forming a plurality of third insulating spacers adjacent to the second conducting spacers with the rough surface; removing the insulating layer and the third insulating spacers to form a storage-node capacitor plate composed of the first conducting spacers, the second conducting spacers, and the conducting layer; forming a dielectric layer on the storage-node capacitor plate; and forming an upper plate on the dielectric layer.

10 Claims, 5 Drawing Sheets

METHOD FOR FABRICATING A CROWN CAPACITOR WITH ROUGH SURFACE

BACKGROUND OF THE INVENTION

1. Field of the Invention

The present invention relates to a method for fabricating a crown capacitor, and more particularly to a method for fabricating a crown capacitor with a rough surface.

2. Description of the Related Art

Recently, capacitors have become more important in semiconductor circuit design; it is a circuit device that can't be substituted. For example, the device is widely used in dynamic random access memory (DRAM), oscillators, time delay circuitry, an analog/digital (A/D) converters, digital/analog (D/A) converters, and many other application circuits.

A capacitor is basically composed an insulating material disposed between two conducting layers. The ability of a capacitor to store charge is related to three physical characteristics: (1) the width of the insulating material; (2) the surface of the plates; and (3) the electric and/or mechanical characteristics of the insulating material and the plates.

Take a DRAM for example. In order to better integrate memory, a large number of memory cells must be fit in a memory circuit; thus, the base area of a memory cell must be minimized. Also, the plates of a memory cell must have sufficient surface area to store enough charge.

According to the reasons described above, a three-dimensioned stacked capacitor cell (STC) has been developed for a compact memory device. The space in the wafer under the device is used so that the surface areas of the plates of the capacitor are increased. The advantages of this structure are the low soft error rate (SER), and the fact that it can be combined with an insulating layer with high dielectric constant.

In order to increase the capacitance of a DRAM memory cell capacitor, it has been determined to be advantageous to form a rough surface on the storage-node capacitor plates. Referring to FIG. 1, the process begins with thermal oxidation of P-substrate 100, such as local oxidation (LOCOS) to form a field insulator 101 to insulate an active area. Then semiconductor processes like deposition, photolithography, and ion implantation are applied to form a wordline 141 connecting to another memory cell and to form a semiconductor device, for example a transistor 143 composed of a gate 141' and diffusion regions including a source region and a drain region. The wordline 141 and the gate 141' are formed of polycrystalline silicon.

Next, a boro-phospho-silicate-glass (BPSG) layer 148 is formed to isolate the transistors and a conducting layer is formed thereafter. The BPSG layer 148 is defined by the processes of photolithography and etching to form an opening to be, for example, a source or a drain contact hole. Then a polycrystalline silicon layer (not shown) is formed upon the BPSG layer 148 and is filled in the source or the drain contact hole so that a plug 147 electrically contacting the source region 145 is formed. Then the polycrystalline silicon plates 210 are etched back to form a storage-node capacitor. Then a hemispherical-grain (HSG) polycrystalline silicon is selectively grown on the surface of the plates. Then a dielectric layer 230 is conformably formed on the storage-node capacitor plates 210 with HSG polycrystalline silicon. An upper plate 250 is then formed on the dielectric layer 230 and the fabrication of a capacitor of a DRAM cell is completed.

As described above, the growth of HSG polycrystalline silicon must be selective to prevent the storage-node capacitor plates from short-circuiting with each other. Furthermore, the residual impurity on the storage-node capacitor plates will cause the phenomenon of the discontinuous growth of the HSG polycrystalline silicon. Further, it is difficult to fill the dielectric layer into the space 270 because the HSG polycrystalline silicon on the side-walls of the storage-node capacitor plates 210 fills in and decreases the size of the space 270.

SUMMARY OF THE INVENTION

Accordingly, the object of this invention is to provide a crown capacitor with a rough surface, with which a DRAM of high capacitance can be formed.

The object of the invention relies upon a method for fabricating a crown capacitor with a rough surface on a substrate, comprising the steps of: forming a conducting layer which contacts the semiconductor source diffusion region on the substrate; forming an insulating layer on the conducting layer to form a stacked layer comprising the insulating layer and the conducting layer; defining the stacked layer to form a residue portion of the stacked layer adjacent to the semiconductor diffusion region; forming a plurality of first conducting spacers adjacent to side-walls of the stacked layer; forming a plurality of second conducting spacers having a rough surface adjacent to the first conducting spacers; forming a plurality of third insulating spacers adjacent to the second conducting spacers with the rough surface; removing the insulating layer and the third insulating spacers to form a storage-node capacitor plate composed of the first conducting spacers, the second conducting spacers, and the conducting layer; forming a dielectric layer on the storage-node capacitor plate; and forming an upper plate on the dielectric layer.

BRIEF DESCRIPTION OF THE DRAWINGS

These and other features of the present invention will now be described in detail with reference to the accompanying drawings, in which.

DETAILED DESCRIPTION OF THE PREFERRED EMBODIMENT

Figure 1:
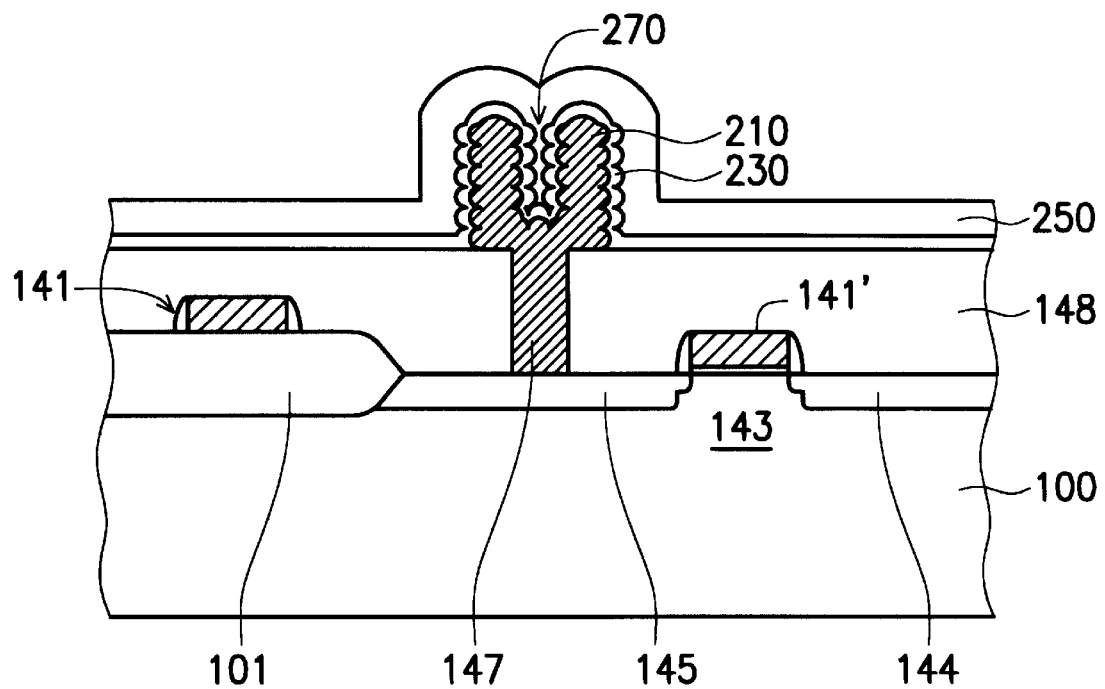
FIG. 1 shows the cross-sectional of a portion of a conventional in-process crown capacitor with a rough surface on a wafer.
Figure 2:
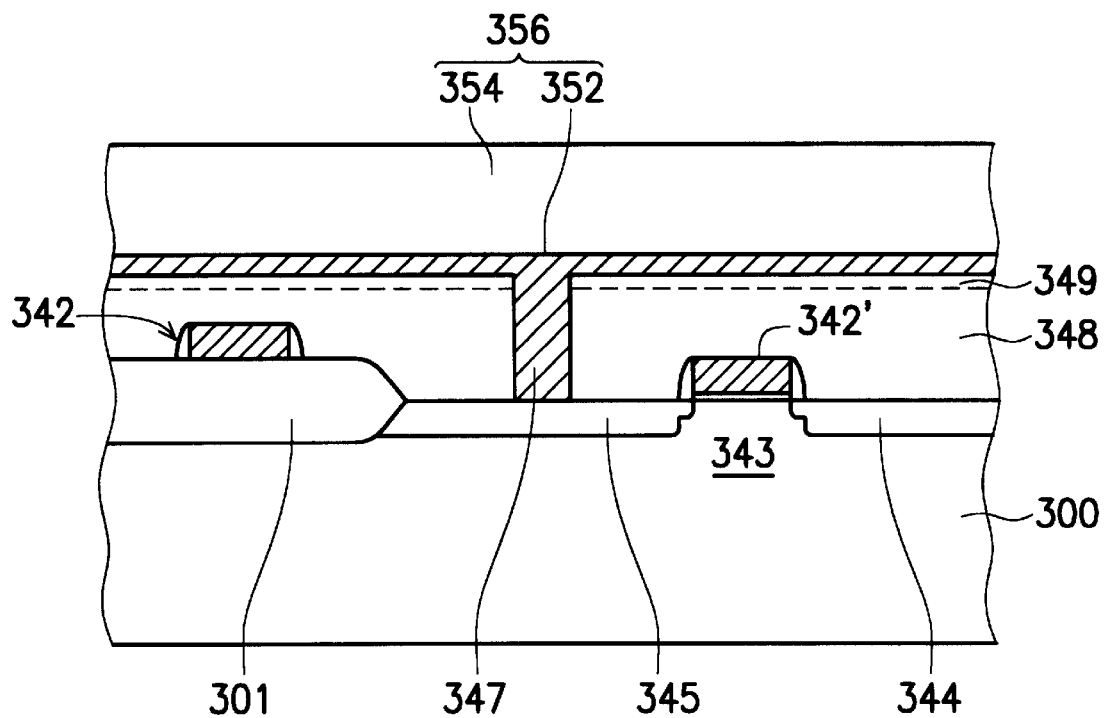
FIGS. 2~10 show cross-sectional views of the invention of the fabrication of a crown capacitor with a rough surface according to the method of this invention.

Please refer to FIG. 2. In the initial step of the process, the material of the substrate 300 can be silicon or germanium, and its formation can be epitaxial or silicon on insulator. For convenience, this embodiment takes a P-type silicon substrate as an example.

The first step is forming a transistor with a P-type substrate by common technologies. Then a field oxide 301 is formed, the thickness of which is 1500 to 3000 Å, according to shallow trench isolation process (STI) or a thermal oxidation such as local oxidation (LOCOS) in order to isolate active areas. Next, a wordline 342 connecting to other memory devices and semiconductor devices (such as a transistor 343 composed of a gate 342' and diffusion regions) is formed upon the active area by semiconductor processes such as deposition, photolithography, and ion implantation. The material of the wordline 342 and the gate 342' is polycrystalline silicon, and a source region 345 and a drain region 344 are included in the diffusion regions.

Then an inter isolating layer 348 (for example, a BPSC layer) is formed to isolate the transistor and a conducting layer is formed thereafter. The inter isolating layer 348 is formed by the atmosphere chemical vapor deposition (APCVD) process with primary reactors such as tetra-ethyl-ortho-silicate (TEOS), $O_3/O_2$, tri-ethyl-borate (TEB), and tri-methyl-phosphate (TMP). The thickness of the inter isolating layer 348 is about 5000 Å.

Then the inter isolating layer 348 is defined according to a photolithography process to form an opening such a source or a drain contact hole. Thereafter, a conducting layer 352 is formed on the inter isolating layer 348 and is filled into the source or the drain contact hole in order to form a plug 347 to contact the source region 345. The material of the conducting layer 352 has a thickness of 500 to 2000 Å and may be polycrystalline silicon doped with ions. The conducting layer is formed by the low pressure chemical vapor deposition (LPCVD) process with a primary reactor such as silane. The conducting layer is doped with ions (e.g., Arsenic or Phosphorus ions), or an in-situ doped method is used to form a doped polycrystalline silicon layer.

Then an insulating layer 354 with a thickness of 3000~10000 Å is formed upon the conducting layer 352, forming a stacked layer 356. It is noted that if the material of the insulating layer 354 is the same as that of the inter material layer 348, an etching stop layer 349 should be deposited upon the inter insulating layer 348 (for example, a silicon nitride layer as shown in the FIG. 2) to prevent the insulating layer 354 and the inter insulating layer 348 from being etched in the same step.

Figure 3:
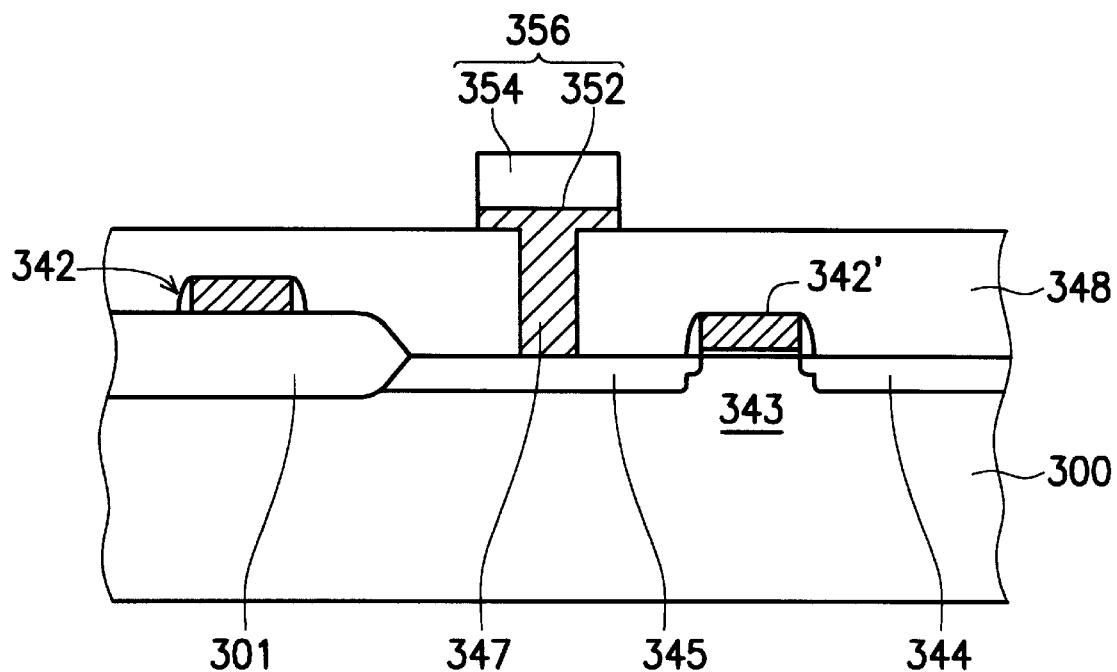

Referring to FIG. 3, the stacked layer 356, including the insulating layer 354 and the conducting layer 352, is defined utilizing a photolithography process and an etching process. For example, a patterning photo resist as a mask (not shown) is coated on the surface of the insulating layer 354. Subsequently, the insulating layer 354 and the polycrystalline silicon layer 352 are defined by anisotropic etching process to form a portion of the crown capacitor that will be formed in the subsequent processes.

Figure 4:
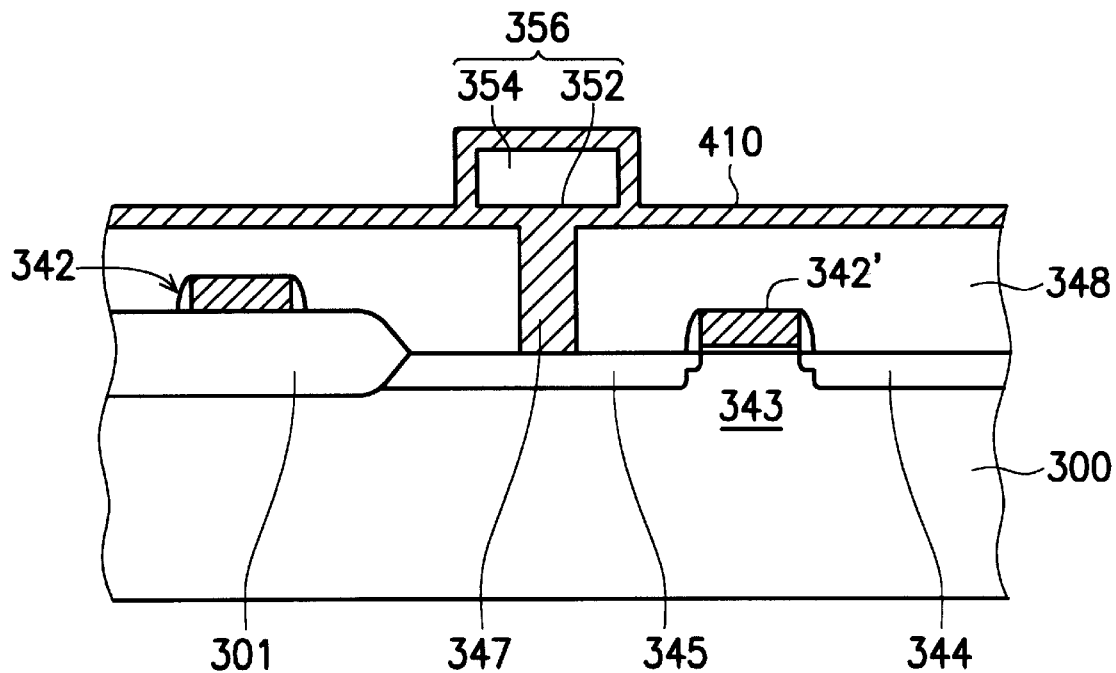

Referring to FIG. 4, a conducting layer 410 is deposited, wherein the material of the conducting layer 410 may be polycrystalline silicon formed by LPCVD process with a primary reactor such as silane and have a thickness of 500 to 2000 Å. The conducting layer 410 covers the insulating layer 348 and the stacked layer 356 to form conducting spacers in the subsequent processes. In order to be conductive, the conducting layer is doped with ions (for example, Arsenic or Phosphorus ions) utilizing diffusion or ion implantation, or using an in-situ doping method, to form a doped polycrystalline silicon layer.

Figure 5:
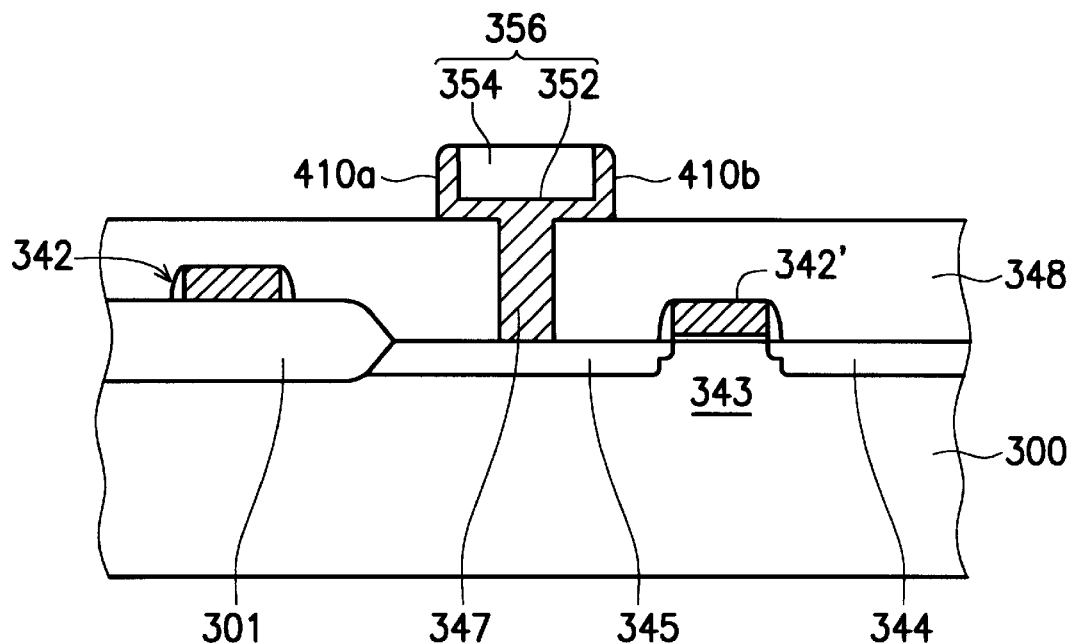

Referring now to FIG. 5, a step of forming spacers 410a, 410b is schematically shown. The conducting layer 410 is etched back to remove the conducting layer above the insulating layer 354 and the inter insulating layer 348 so that the spacers 410a, 410b are formed on the sidewalls of the stacked layer 356. The conducting layer 410 can be etched back by the reactive ion etching process utilizing Chlorine ($Cl_2$), Hydrogen Chloride (HCl), or Silicon-Chloride ($SiCl_4$) as the etching reacting gas to form the spacers 410a and 410b.

Figure 6:
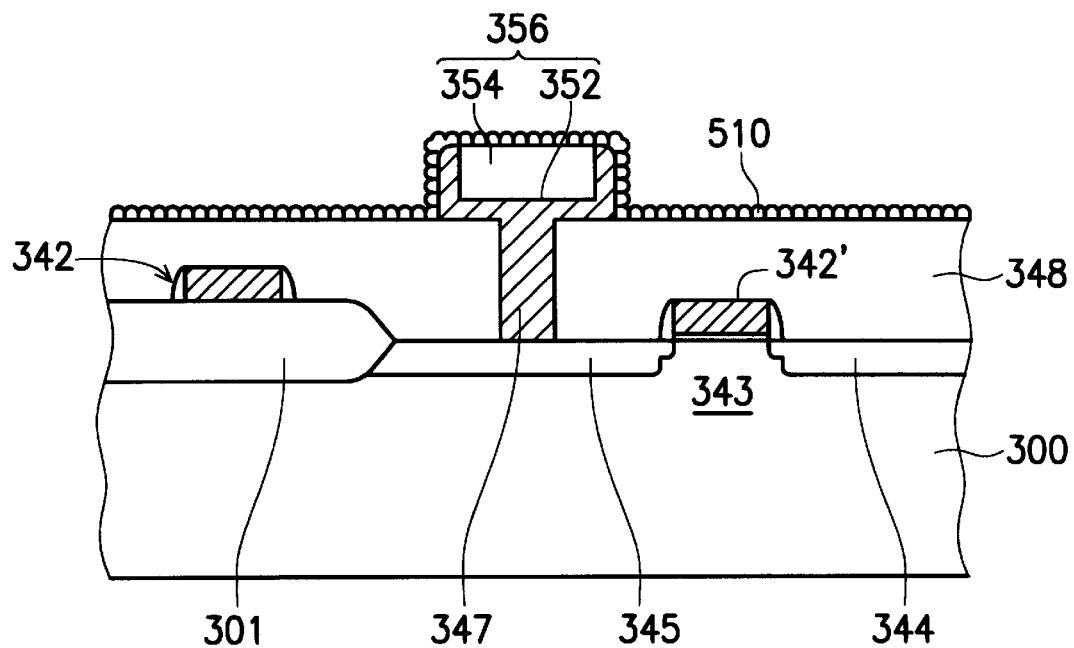

Referring to FIG. 6, a conducting layer 510 with a rough surface is formed, wherein the material of the conducting layer 510 is polycrystalline silicon and the thickness is about 500 to 1000 Å. The rough surface of the conducting layer 510 is achieved by a LPCVD process with a primary reactor such as silane, wherein the temperature of the reacting environment is about 500° C. to 600° C., and the pressure of the environment is about 0.2 torr to 1 torr. The object of the formation of the rough polycrystalline silicon layer is to conformably cover the stacked layer 356, the spacers 410a, 410b, and the insulating layer 348. Conducting spacers with rough surfaces are formed in subsequent processes.

Figure 7:
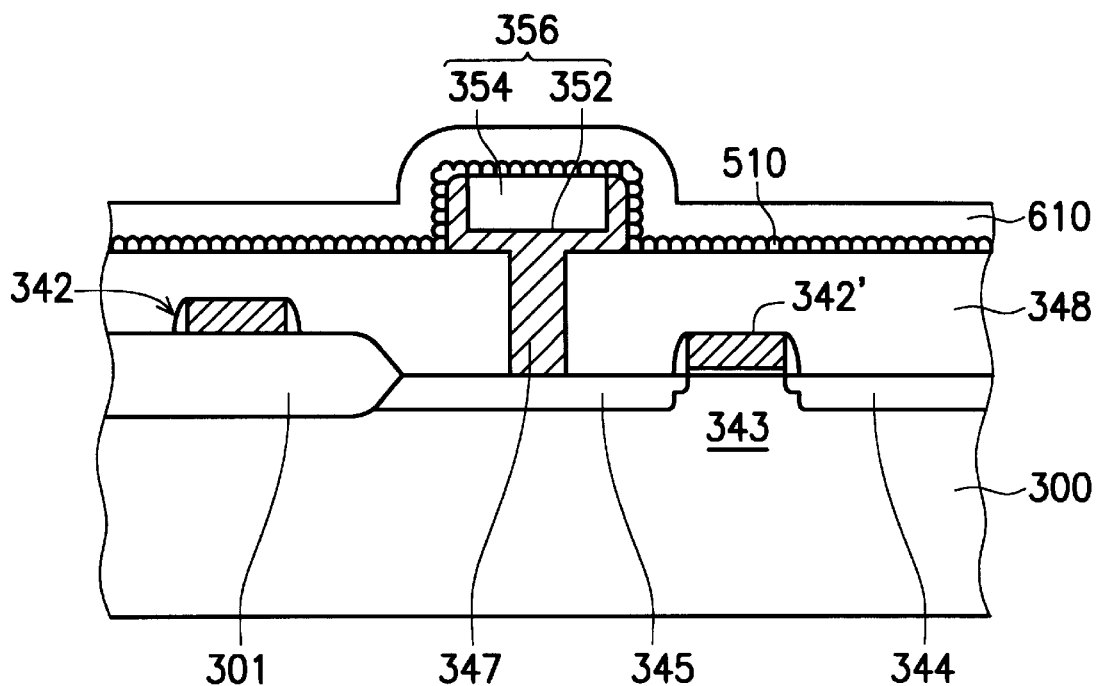

Referring to FIG. 7, an insulating layer 610 is formed, wherein the material of the insulating layer 610 can be an non doped silicon glass (NSG) layer. For example, the insulating layer is a silicon di-oxide ($SiO_2$) layer with thickness of 500 to 2000 Å formed by the APCVD process on the conducting layer 510 with a rough surface.

Figure 8:
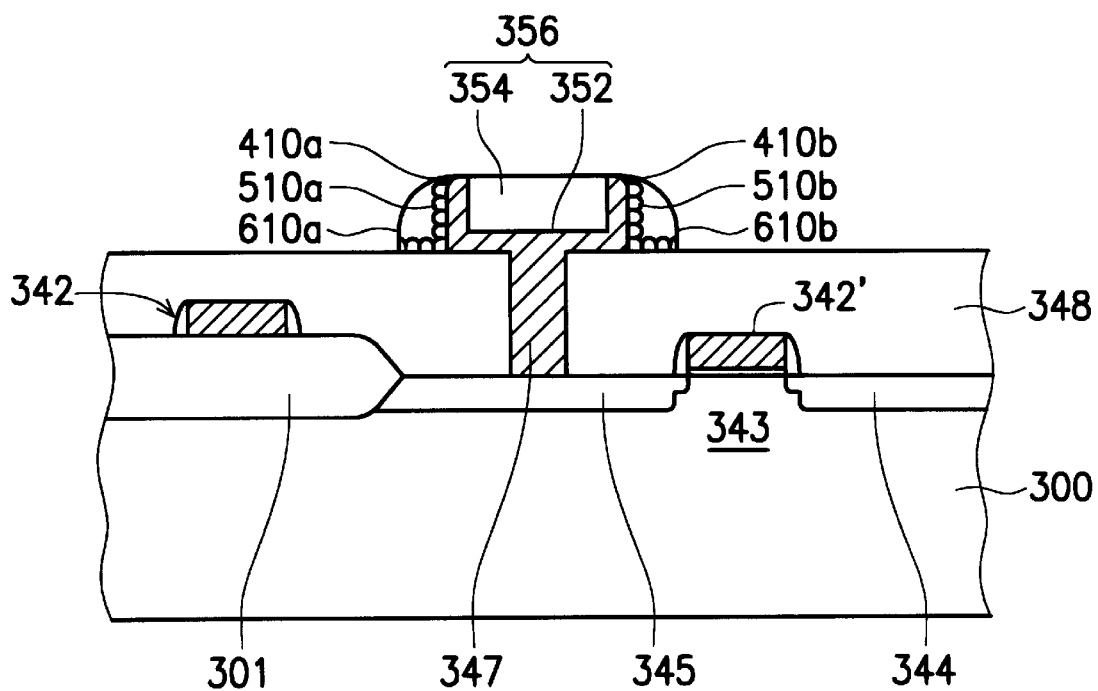

Referring to FIG. 8, the step of forming spacers 510a, 510b, and 610a, 610b is shown. For example, the NSG layer 610 and the polycrystalline silicon layer 510 with a rough surface are etched back to form spacers 510a, 510b adjacent to spacers 410a, 410b, and spacers 610a, 610b adjacent to spacers 510a, 510b.

Figure 9:
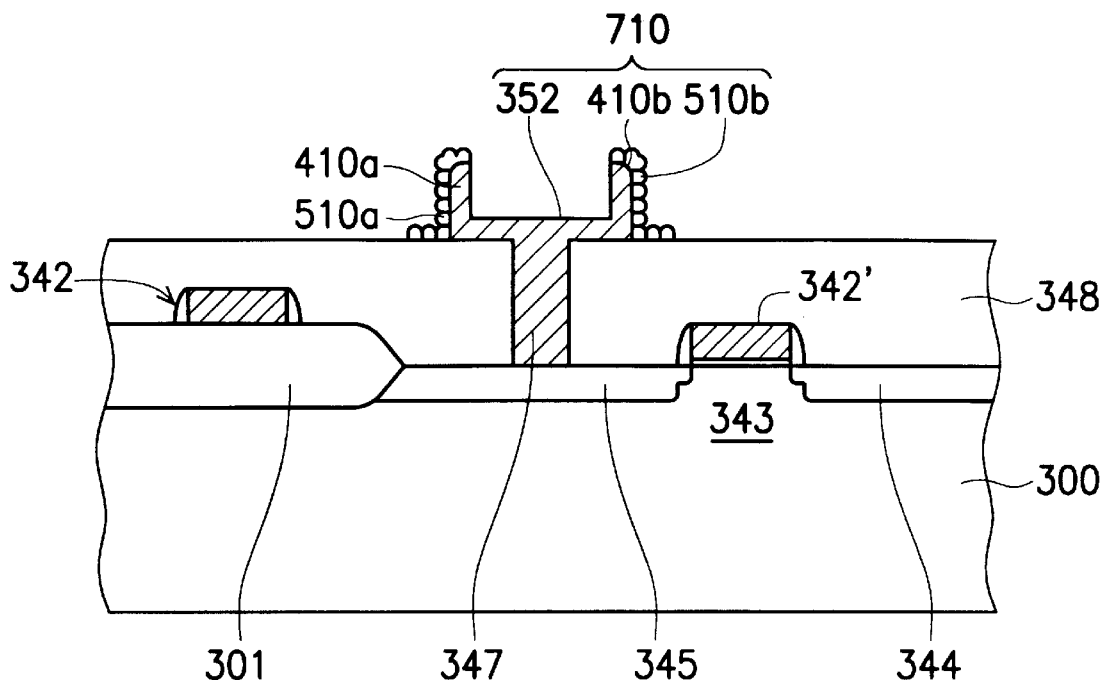

Referring to FIG. 9, the step of forming a node of a capacitor is shown. For example, the stacked layer 356, composed of an insulating layer 352 and spacers 610a, 610b, is removed to form a storage-node capacitor plate 710 of the capacitor composed of the spacers with rough surface 510a, 510b, the spacers composed of polycrystalline silicon 410a, 410b, and the doped polycrystalline silicon layer 352.

Figure 10:
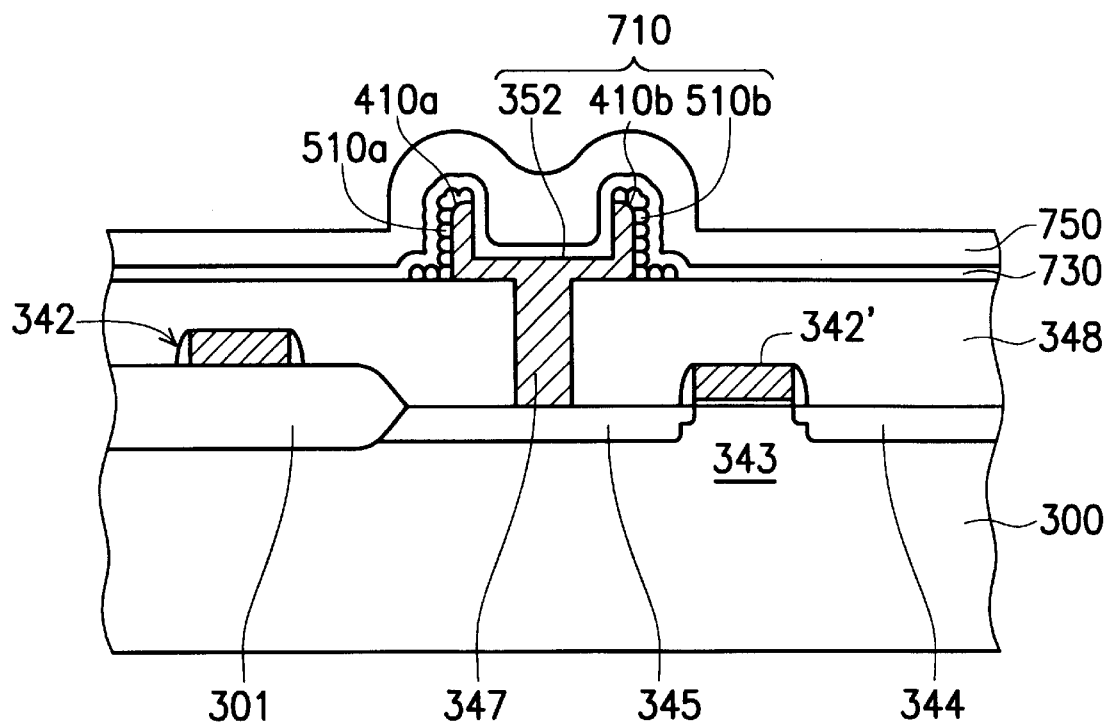

Referring now to FIG. 10, a dielectric layer 730 is formed on the storage-node capacitor plate 710, and then an upper electrode 750 is formed on the dielectric layer 730. For example, an dielectric layer 730 with high dielectric constant (such as oxynitride oxide (ONO) or tantalum oxide ($Ta_2O_5$) is coated on the storage-node capacitor plate 710 with a thickness of about 30 to 100 Å. Next, a conducting layer 750 is formed to be the upper electrode of the capacitor. For example, a polycrystal line silicon layer 750 with a thickness of 1000 to 3000 Å is formed by LPCVD process with a primary reactor such as silane. The polycrystalline silicon layer 750 is doped with ions (e.g., Arsenic or Phosphorus ions) according to a process of diffusion, or using an in-situ doping, to form a doped conducting layer. Accordingly, a crown capacitor with a rough surface is constructed with the storage-node capacitor plate 710, the dielectric layer 730, and the upper electrode 750, wherein the rough surface is not formed on the inter side-walls of the storage-node capacitor plate 710 so that the space between the spacers 410a and 410b is not filled with a conducting layer. Thus, the dielectric layer is easily filled in the space.

While the present invention has been described and illustrated herein with reference to the preferred embodiment thereof, it will be understood by those skilled in the art that various changes in the form and details may be made therein without departing from the spirit and the scope of the invention.

What is claimed is:

1. A method for fabricating a crown capacitor with a rough surface on a substrate having a semiconductor diffusion region comprising the steps of:

forming a conducting layer which contacts the semiconductor diffusion region on the substrate;

forming an insulating layer on the conducting layer to form a stacked layer comprising the insulating layer and the conducting layer;

defining the stacked layer to form a residue portion of the stacked layer adjacent to the semiconductor diffusion region;

forming a plurality of first conducting spacers adjacent to side-walls of the stacked layer;

forming a plurality of second conducting spacers having a rough surface adjacent to the first conducting spacers;

forming a plurality of third insulating spacers adjacent to the second conducting spacers with the rough surface;

removing the insulating layer and the third insulating spacers to form a storage-node capacitor plate composed of the first conducting spacers, the second conducting spacers, and the conducting layer;

forming a dielectric layer on the storage-node capacitor plate; and forming an upper plate on the dielectric layer.

2. The method for fabricating a crown capacitor as described in claim 1, wherein the material of the conducting layer is polycrystalline silicon.

3. The method for fabricating a crown capacitor as described in claim 1, wherein the material of the insulating layer is boro-phospho-silicate-glass (BPSG).

4. The method for fabricating a crown capacitor as described in claim 1, wherein the material of the first conducting spacers is polycrystalline silicon.

5. The method for fabricating a crown capacitor as described in claim 1, wherein the second conducting spacers with rough surfaces are formed by low pressure chemical vapor deposition (LPCVD) with a primary reactor such as silane under a temperature of about 500 to 600° C. and a pressure of about 0.2 to 1 torr.

6. The method for fabricating a crown capacitor as described in claim 1, wherein the material of the third insulating spacers is non-doped silicon glass (NSG).

7. A method for fabricating a crown capacitor with a rough surface on a substrate having a semiconductor source diffusion region comprising the steps of:

forming a first- conducting layer which contacts the semiconductor source diffusion region on the substrate;

forming a first insulating layer on the first conducting layer to form a stacked layer comprising the first insulating layer and the first conducting layer;

defining the stacked layer to form a residue portion of the stacked layer adjacent to the semiconductor source diffusion region;

forming a second conducting layer conformably on the substrate and the stacked layer;

etching back the second conducting layer to form first conducting spacers adjacent to side-walls of the stacked layer;

forming a third conducting layer having a rough surface conformably on the substrate, the first conducting spacers, and the stacked layers;

forming a second insulating layer conformably on the third conducting layer having the rough surface;

etching back the second insulating layer and the third conducting layer having a rough surface to form second conducting spacers having a rough surface adjacent to the first conducting spacers, and third insulating spacers adjacent to the second conducting spacers;

removing the first insulating layer and the third insulating spacers to form a storage-node capacitor plate composed of the first conducting spacers, the second conducting spacers, and the first conducting layer;

forming a dielectric layer on the storage-node capacitor plate; and forming an upper plate on the dielectric layer.

8. The method for fabricating a crown capacitor as described in claim 7, wherein the third conducting layer with a rough surface is formed by the low pressure chemical vapor deposition (LPCVD) process with a primary reactor such as silane.

9. The method for fabricating a crown capacitor as described in claim 8, wherein the temperature of the environment is about 500 to 600° C. and the pressure is about 0.2 to 1 torr, and the thickness of the third conducting layer is about 500 to 1000 Å.

10. A method for fabricating a crown capacitor with a rough surface on a substrate having a semiconductor source diffusion region comprising the steps of:

forming a first BPSG layer on the substrate;

forming an etching stop layer on the first BPSG layer;

defining the etching stop layer and the first BPSG layer to form an opening exposing the semiconductor source diffusion region;

forming a first doped polycrystalline silicon layer filled into the opening which contacts the semiconductor source diffusion region on the etching stop layer;

forming a second BPSG layer on the first doped polycrystalline silicon layer to form a stacked layer;

defining the stacked layer to form a residue portion of the stacked layer adjacent to the semiconductor source diffusion region;

forming a second doped polycrystalline silicon layer conformably on the etching stop layer and the stacked layer, etching back the second doped polycrystalline silicon layer to form a first conducting spacers composed of the doped polycrystalline silicon layer adjacent to side-walls of the stacked layer;

forming a polycrystalline silicon layer having a rough surface conformably on the etching stop layer, the first conducting spacers, and the stacked layers;

forming a non doped silicon glass conformably on the polycrystalline silicon layer with the rough surface, etching back the non doped silicon glass and the polycrystalline silicon layer having a rough surface to form second conducting spacers having a rough surface adjacent to the first conducting spacers, and third insulating spacers composed of non doped silicon glass adjacent to the second conducting spacers with the rough surface;

removing the second BPSG layer and the third insulating spacers to form a storage-node capacitor plate composed of the first conducting spacers, the second conducting spacers with the rough surface, and the first doped polycrystalline silicon layer;

forming a dielectric layer on the storage-node capacitor plate; and forming an upper plate on the dielectric layer.

* * * * *